United States Patent
Li et al.

(10) Patent No.: US 6,376,298 B1
(45) Date of Patent: Apr. 23, 2002

(54) LAYOUT METHOD FOR SCALABLE DESIGN OF THE AGGRESSIVE RAM CELLS USING A POLY-CAP MASK

(75) Inventors: Weining Li; Yung-Tao Lin, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/494,636

(22) Filed: Jan. 31, 2000

(51) Int. Cl.$^7$ .......................................... H01L 21/8234

(52) U.S. Cl. ...................... 438/238; 438/592; 438/639

(58) Field of Search ............................... 438/233, 238, 438/592, 595, 639, 655, 656

(56) References Cited

U.S. PATENT DOCUMENTS

| | | | |
|---|---|---|---|
| 5,573,980 A | | 11/1996 | Yoo ............................. 437/200 |
| 5,605,853 A | | 2/1997 | Yoo et al. ...................... 437/43 |
| 5,719,079 A | | 2/1998 | Yoo et al. ...................... 438/238 |
| 5,843,816 A | * | 12/1998 | Liaw et al. ................... 438/238 |
| 5,899,742 A | * | 5/1999 | Sun ............................. 438/233 |
| 6,258,678 B1 | * | 7/2001 | Liaw ........................... 438/639 |

OTHER PUBLICATIONS

S. Wolf, "Silicon Processing for the VLSI Era," vol. 2: Process Integration, Lattice Press, Sunset Beach, CA, c. 1990, pp. 144–149.
C.Y. Chang et al., "ULSI Technology", McGraw–Hill, New York, NY, c. 1996, pp. 397–402 and 487–488.

* cited by examiner

Primary Examiner—Chandra Chaudhari
(74) Attorney, Agent, or Firm—George O. Saile; Rosemary L. S. Pike

(57) ABSTRACT

A method for integrating salicide and self-aligned contact processes in the fabrication of integrated circuits by using a poly cap mask and a special layout technique is described. A pair of gate electrodes and associated source and drain regions are formed overlying a semiconductor substrate wherein nitride spacers are formed on sidewalls of the gate electrodes. A poly-cap layer is deposited overlying the gate electrodes and source and drain regions. The poly-cap layer is selectively removed overlying one of the source and drain regions between the gate electrode pair where a self-aligned contact is to be formed and removed over one of the gate electrode pair. An insulating layer is deposited over the surface of the semiconductor substrate. The planned self-aligned contact opening is made through the insulating layer to the source/drain region to be contacted wherein the contact opening partially overlies the poly-cap layer over the adjacent gate electrode of the pair. The self-aligned contact opening is filled with a conducting layer to complete fabrication of the integrated circuit device.

20 Claims, 7 Drawing Sheets

LAYOUT METHOD FOR SCALABLE DESIGN OF THE AGGRESSIVE RAM CELLS USING A POLY-CAP MASK

BACKGROUND OF THE INVENTION (1) Field of the Invention

The present invention relates to the fabrication of integrated circuit devices, and more particularly, to a method of integrating salicide and self-aligned contact processes using a unique layout method in the fabrication of integrated circuits.

(2) Description of the Prior Art

In the fabrication of integrated circuit devices, logic products are often produced using salicide (self-aligned silicide) processes in order to obtain higher circuit performance. In silicidation, a refractory metal layer is deposited and then annealed. The underlying silicon reacts with the refractory metal layer to produce a silicide overlying the gate electrode and source and drain regions. The silicided gate and source/drain regions have lower resistance than non-silicided regions, especially in smaller geometries, and hence, higher circuit performance.

In the production of memory units, the self-aligned contact (SAC) has been widely used to reduce cell size, thus greatly increasing the device density for the CMOS product design. With the advent of Large Scale Integration (LSI) many of the integrated circuits formed on semiconductor substrates comprise several circuit functions on a single chip. For example, memory devices are formed on the same chip as the logic circuits which address them. It is desired to find a method of integrating the salicide and the SAC processes on one wafer so that both high logic performance and high density memory for embedded memory can be achieved.

The standard SAC process needs to use an insulator-capped polysilicon. This makes the process incompatible with the salicide process. Co-pending U.S. patent application Ser. No. 09/298,933 to Weining et al, filed on Apr. 26, 1999, provided a method for integrating salicide and self-aligned contact processes in the fabrication of logic circuits with embedded memory by using an additional poly-cap masking layer. But the traditional approach for this process will require very tight process control for the small poly-cap space in order to achieve small RAM cell size. This limitation greatly increases the process difficulties and cost.

Silicidation has been widely used in the art. Silicidation techniques and self-aligned contacts are discussed in *Silicon Processing for the VLSI Era*, Vol. 2, by S. Wolf, Lattice Press, Sunset Beach, Calif., c. 1990, pp. 144–149 and in *ULSI Technology*, by C. Y. Chang and S. M. Sze, McGraw-Hill, New York, N.Y., c. 1996, pp.397–402 and 487–488. U.S. Pat. No. 5,573,980 to Yoo shows a method of forming a salicided SAC for an SRAM, but with no embedded logic. U.S. Pat. Nos. 5,605,853 and 5,719,079, both to Yoo et al teach formation of a 4T SRAM and floating gate memory and logic device including salicide and a butted contact, but not including a SAC.

SUMMARY OF THE INVENTION

Accordingly, it is a primary object of the present invention to provide an effective and very manufacturable method for integrating salicide and self-aligned contact processes in the fabrication of integrated circuits.

It is a further object of the invention to provide a process for integrating salicide and self-aligned contact processes in the fabrication of logic circuits with embedded memory.

Yet another object is to form salicided gate and source/drain regions in the logic circuits of an integrated circuit device while also forming self-aligned contacts in the memory circuits of the same integrated circuit device.

Yet another object of the invention is to form salicided gate and source/drain regions in the logic circuits of an integrated circuit device while also forming self-aligned contacts in the memory circuits of the same integrated circuit device using a special layout technique.

A still further object of the invention is to provide a method for integrating salicide and self-aligned contact processes by using a poly cap mask and a special layout technique to achieve cell size reduction while avoiding process difficulties.

In accordance with the objects of the invention, a method for integrating salicide and self-aligned contact processes in the fabrication of integrated circuits by using a poly cap mask and a special layout technique is achieved. A pair of gate electrodes and associated source and drain regions are formed overlying a semiconductor substrate wherein nitride spacers are formed on sidewalls of the gate electrodes. A poly-cap layer is deposited overlying the gate electrodes and source and drain regions. The poly-cap layer is selectively removed overlying one of the source and drain regions between the gate electrode pair where a self-aligned contact is to be formed and removed over one of the gate electrode pair. An insulating layer is deposited over the surface of the semiconductor substrate. The planned self-aligned contact opening is made through the insulating layer wherein the contact opening touches the adjacent gate electrode of the pair. The self-aligned contact opening is filled with a conducting layer to complete fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

The process of the present invention uses the polysilicon capping mask of co-pending U.S. patent application Ser. No. 09/298,933 along with a special layout technique that will achieve the advantages of cell size reduction afforded by the capping mask while avoiding the process difficulties of the poly-cap mask to reduce costs.

Figure 1A:
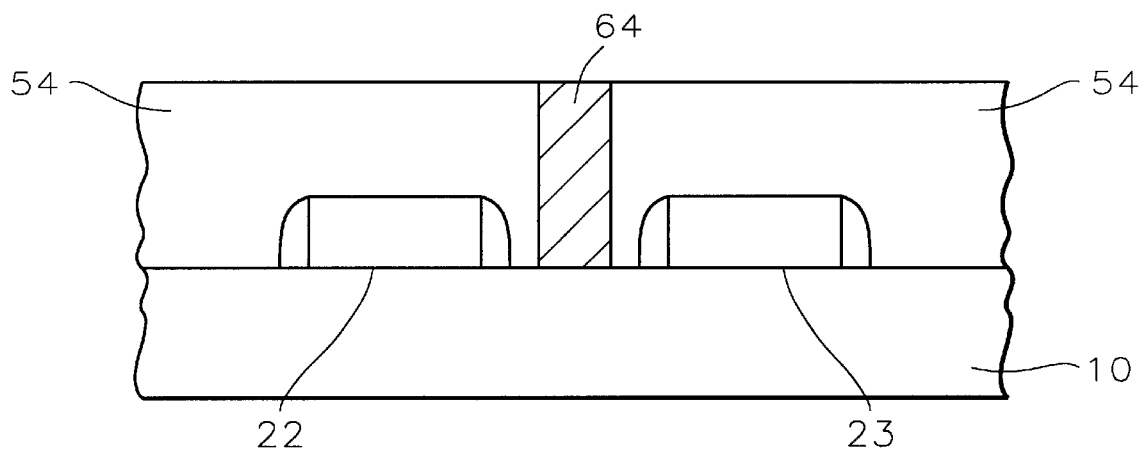
FIGS. 1A and 1B are cross-sectional and top view representations, respectively, of a non-self-aligned contact between two lines.
Figure 1B:
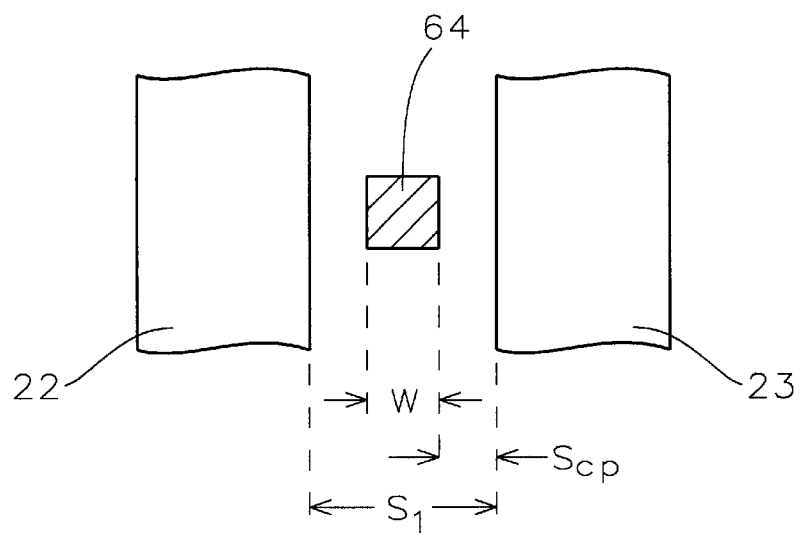

FIGS. 1A and 1B illustrate in cross-section and in a top view, respectively, a random access memory (RAM) cell layout without the use of self-aligned contact (SAC). A contact 64 has been formed through dielectric layer 54 between the polysilicon lines 22 and 23. The width of the contact is W, shown in FIG. 1B. The isolation requirement for contact space to poly without SAC is $S_{cp}$. Thus, the spacing between the two poly lines is $S_1=W+2S_{cp}$.

Figure 2A:
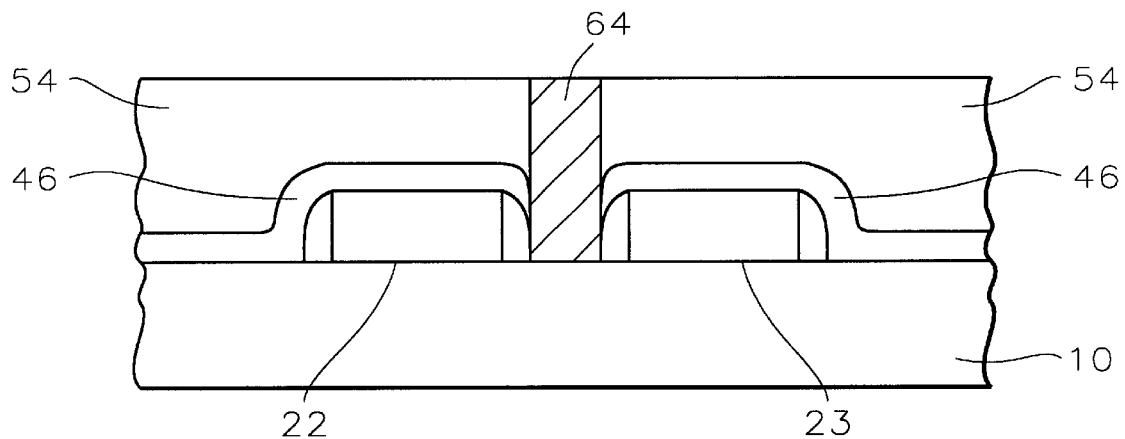
FIGS. 2A and 2B are cross-sectional and top view representations, respectively, of a self-aligned contact between two lines.
Figure 2B:
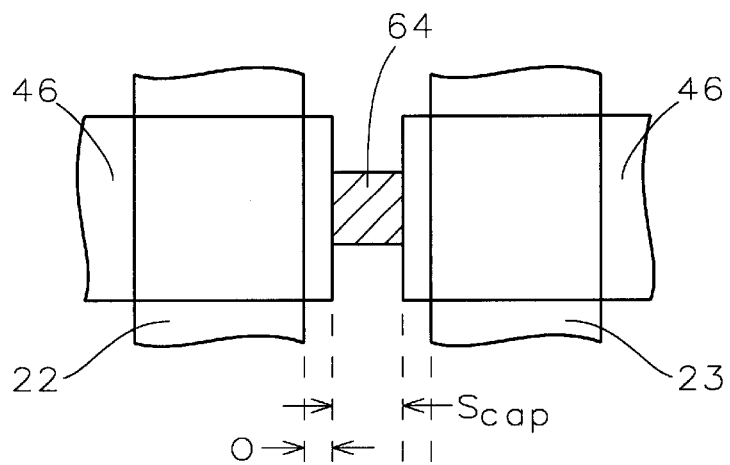

FIGS. 2A and 2B illustrate the SAC of the copending patent application Ser. No. 09/298,933. In this case, the spacing between the two poly lines $S_2$ is determined by the poly-cap spacing $S_{cap}$ and the overlap O of the poly-cap layer to the space between the poly lines. That is, $S_2=S_{cap}+2O$. Given a certain number for O in order to maintain process manufacturability, $S_2$ will be governed by the stepper capability of line to line spacing. This spacing also determines the effective SAC contact width between the two poly gates. In order for $S_2$ to be less than $S_1$, O and $S_{cap}$ must be minimized aggressively. The minimum process design rule for the poly-cap layer calls for very tight process control of critical dimension, misalignment, etc. Normally, the contact size will be very close to or equal to $S_{cap}$. This is called a pseudo-SAC process because there is still a space O, which is not zero, between the contact and the poly gate.

The new layout approach of the present invention is to try to take advantage of allowing the contact space to poly $S_{cp}$ to be zero and to sacrifice the contact area. That is, the contact to the substrate will be smaller. This will cause an insignificant increase in contact resistance which can be overcome by design considerations. In RAM technologies, because the current to each memory cell is very small, so the increase of contact resistance can be taken care of by a proper design.

Figure 3A:
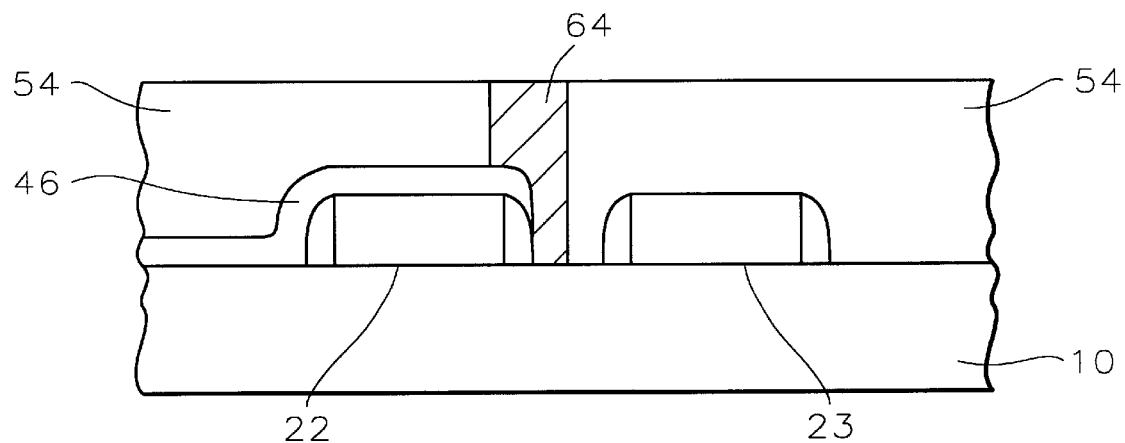
FIGS. 3A and 3B are cross-sectional and top view representations, respectively, of a self-aligned contact between two lines made using the special layout technique of the present invention.
Figure 3B:
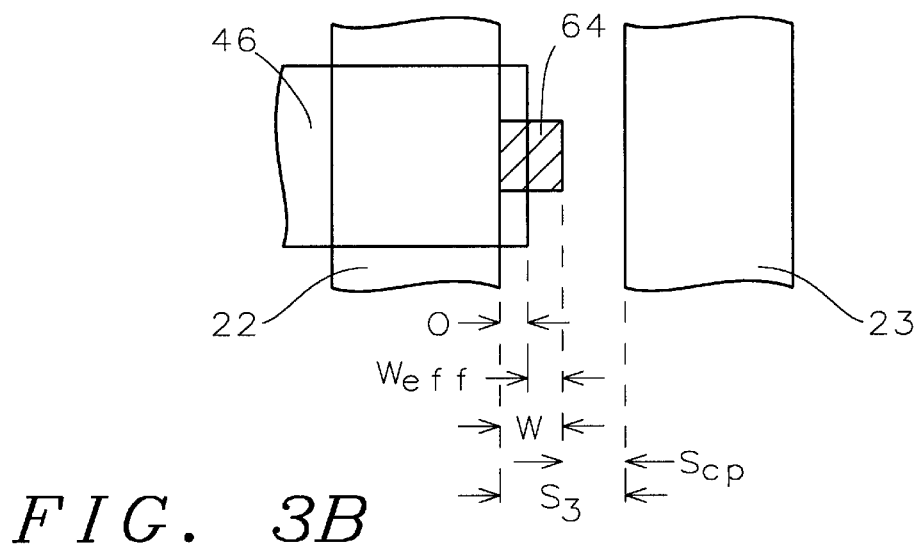

In the special layout technique of the present invention, the contact is moved to touch the edge of one of the poly lines 22. The poly-cap layer 46 is removed over the adjacent poly line 23, as shown in FIGS. 3A and 3B. So, the spacing $S_3$ between the poly lines will be determined by the contact width W and the contact space to poly $S_{cp}$. $S_3=W+S_{cp}$. The effective contact width $W_{eff}=W-O$, where O is the overlap of the poly-cap layer.

Using the special layout illustrated in FIGS. 3A and 3B, the spacing $S_3$ will always be less than the spacing $S_1$. Thus, the limitation of minimum poly-cap spacing is eliminated. In the product and process design, it is now necessary to concentrate only on minimizing $W_{eff}$ and O. This layout approach can be used in bitline contacts and in other contacts between two word lines in dynamic random access memories (DRAM). It can also be used in bitline contacts and in Vss and Vdd contacts in static random access memories (SRAM).

Figure 4A:
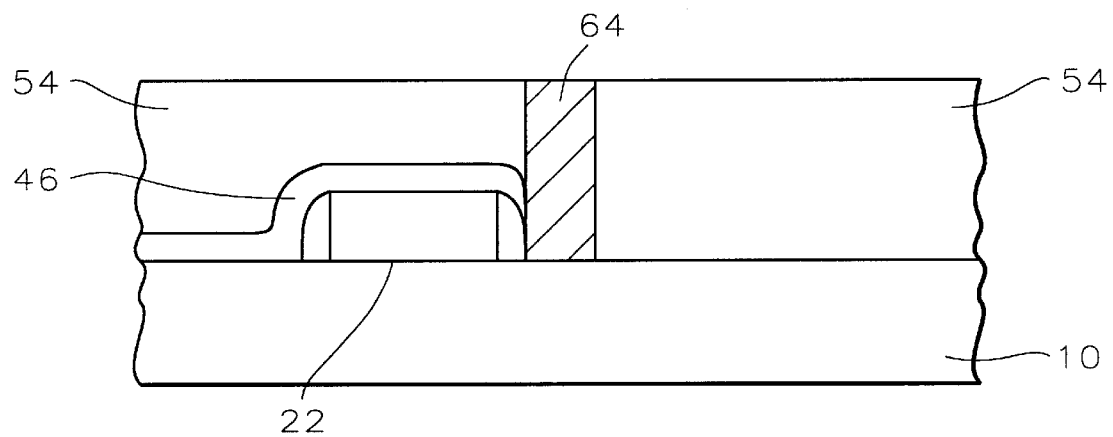
FIGS. 4A and 4B are cross-sectional and top view representations, respectively, of a self-aligned contact to a single line.
Figure 4B:
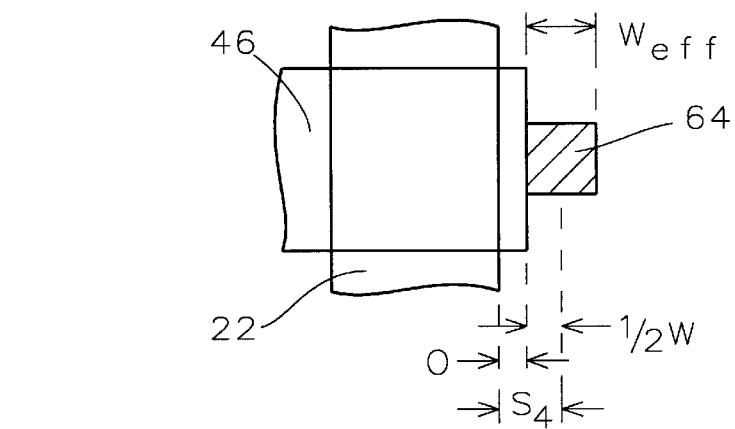

The same layout technique can be used for the contact space to a single poly line. FIGS. 4A and 4B illustrate a single poly line 22 with a contact 64. The spacing between the center of the contact and the poly line in FIG. 4B is $S_4=\frac{1}{2}W+O$. Using the new layout technique in FIGS. 5A and 5B, the contact 64 touches the edge of the poly line 22. Here, $S_5=\frac{1}{2}W$, the space between the center of the contact and the poly line. This approach is very useful in SRAM integrated circuits.

Figure 5A:
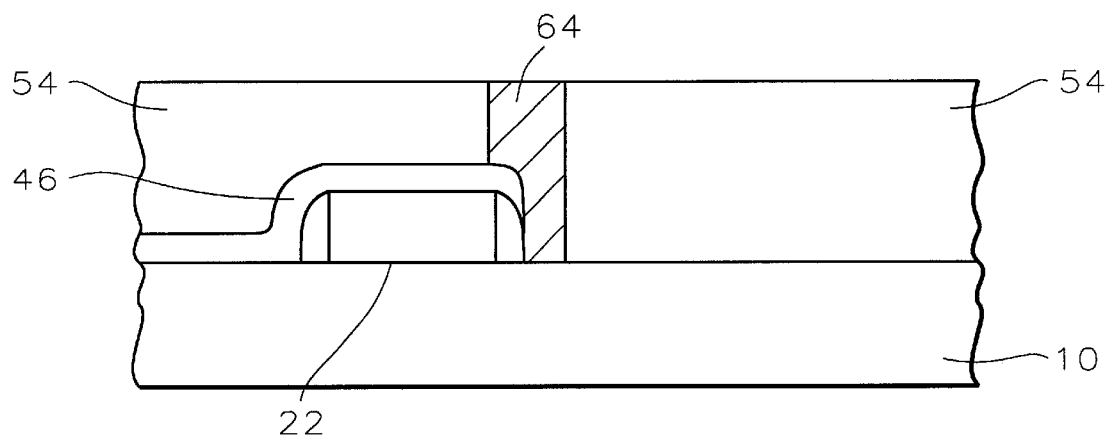
FIGS. 5A and 5B are cross-sectional and top view representations, respectively, of a self-aligned contact to a single line made using the special layout technique of the present invention.
Figure 5B:
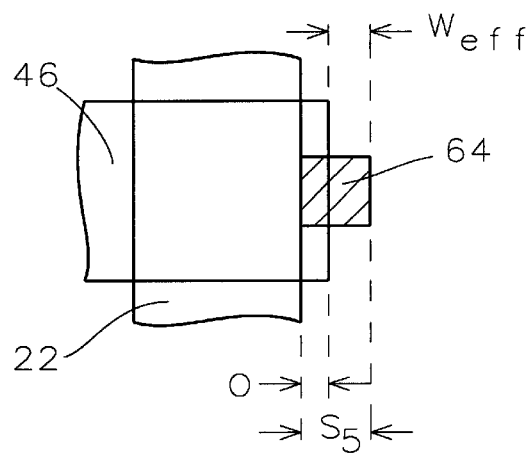

The process of the present invention will be described with reference to FIGS. 6 through 12. These figures illustrate a process in which a SAC is formed between two polysilicon lines. It will be understood by those skilled in the art that the process can be extended to the case in which a SAC contact to a single line is to be made (as shown in FIGS. 5A and 5B). The process of the present invention is fully compatible with the salicide process, although it does not have to be used in conjunction with a salicide process, without any impact on device performance. The preferred embodiment of the invention details the inventive SAC process within the salicide process. It will be understood that the invention applies to the case where a salicide process is not used.

Figure 6:
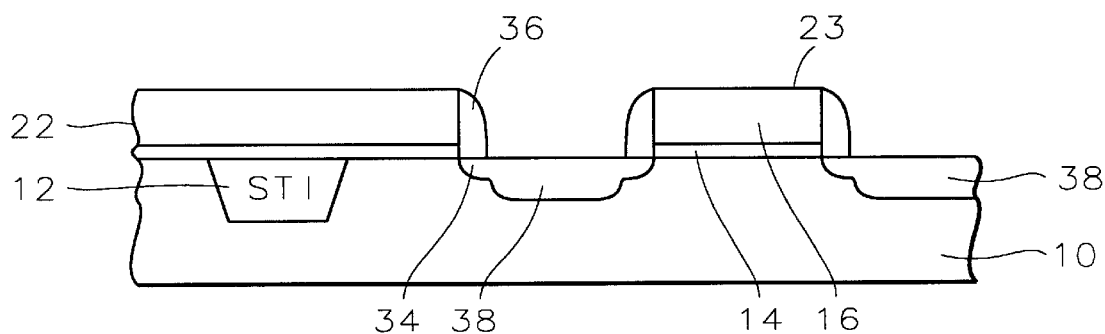
FIGS. 6 through 12 are cross-sectional representations of a preferred embodiment of the present invention.

Referring now more particularly to FIG. 6 there is shown a semiconductor substrate 10, preferably composed of monocrystalline silicon. Isolation regions such as field oxide or shallow trench isolation (STI) regions 12 may be formed as is conventional in the art to isolate active device regions from one another.

A layer of gate oxide 14 is grown over the surface of the substrate, typically to a thickness of between about 30 and 100 Angstroms. A layer of polysilicon 16 is deposited over the gate oxide and field oxide regions to a thickness of between about 1000 and 3000 Angstroms. The polysilicon and gate oxide layers are etched away where they are not covered by a mask to form the gate electrodes 22 and 23. These gate electrodes may be memory devices, such as word lines in a dynamic random access memory (DRAM) cell or pass-gate or pull-down transistors in a static random access memory (SRAM) cell.

The LDD implant to form the transistor lightly doped regions 34 is performed at this time. Both NLDD and PLDD regions are formed using appropriate photomasking, as is conventional. A layer of silicon nitride is deposited over the surface of the substrate and anisotropically etched back to leave silicon nitride spacers 36 on the sidewalls of the gate electrodes 22 and 23. Ion implantations are performed to form heavily doped source and drain regions 38.

Figure 7:
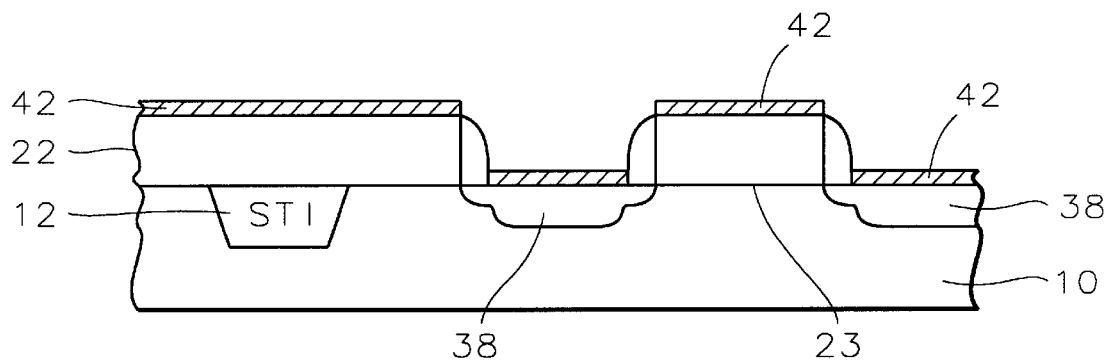

Now, the gate electrodes and source/drain regions may be silicided using the conventional salicide process. Referring to FIG. 7, a layer of titanium, titanium nitride, titanium/titanium nitride, or the like, is deposited over the surface of the substrate, typically by sputtering, to a thickness of between about 200 and 500 Angstroms.

The substrate is annealed, for example, using a rapid thermal anneal (RTA) in a nitrogen ambient at a temperature of 650 to 800° C. for 10 to 30 seconds. The titanium layer reacts with the silicon in the substrate in the source and drain regions 38 and with the polysilicon in the gate electrodes 22 and 23 to form titanium silicide 42. The titanium overlying the silicon nitride sidewalls 36 is unreacted. The unreacted titanium is removed, leaving the salicided gate electrodes 22 and 23 and source and drain regions 38, as shown in FIG. 7.

Figure 8A:
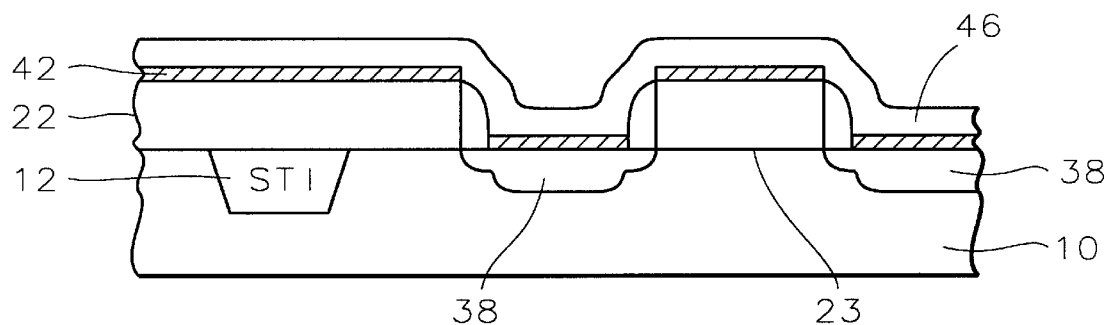

This completes the salicide process. Now, the self-aligned contact process of the present invention will be described. Referring now to FIG. 8A, a liner silicon nitride layer 46 is conformally deposited over the surface of the substrate to a thickness of between about 300 and 1000 Angstroms.

Figure 8B:
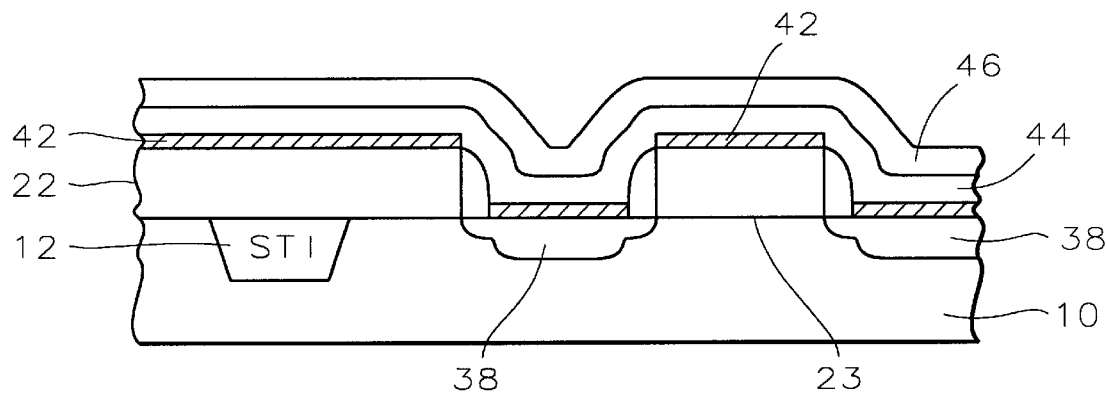

FIG. 8B shows an alternative liner which has a first layer of silicon dioxide 44 having a thickness of between about 100 and 600 Angstroms and a second layer of silicon nitride 46 having a thickness of between about 300 and 1000 Angstroms. Further processing is illustrated using the single liner layer, but it is to be understood that either the single or double liner layer can be used in the process of the invention.

Figure 9:
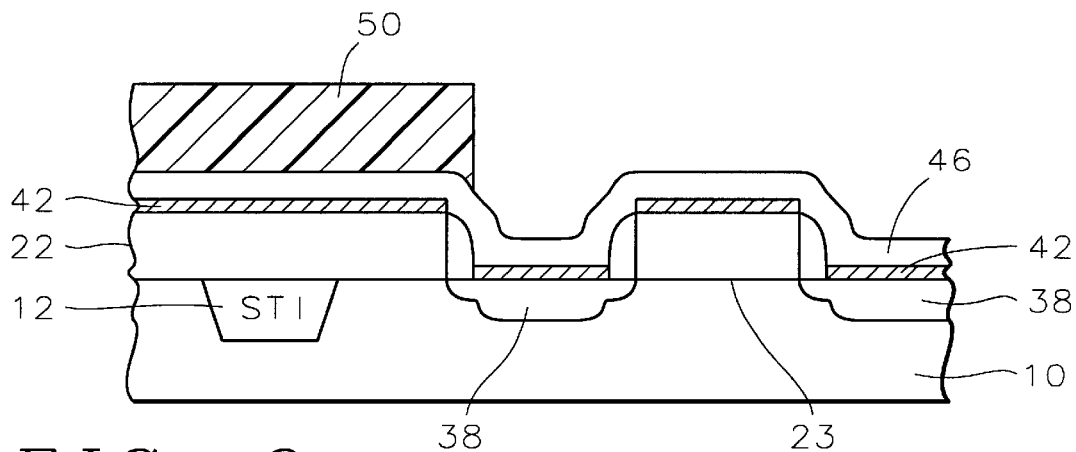

Referring now to FIG. 9, a poly cap photomask 50 is formed over the substrate. The poly-cap layer 46 on top of the polysilicon for the gate contacts must be removed. In the special layout technique of the present invention, only one of the poly lines (22) is protected by the poly cap layer. The poly-cap layer 46 is removed over the adjacent poly line 23. The silicon nitride liner layer (or poly-cap layer) 46 is etched away where it is not covered by the mask 50, as shown in FIG. 10.

The poly cap layer 46 is to prevent the polysilicon from touching the contact when we move the contact to the edge of the poly line. The special feature of this invention is to protect only one of the poly lines instead of both poly lines so that the poly-cap to poly-cap space can be bigger.

Figure 10:
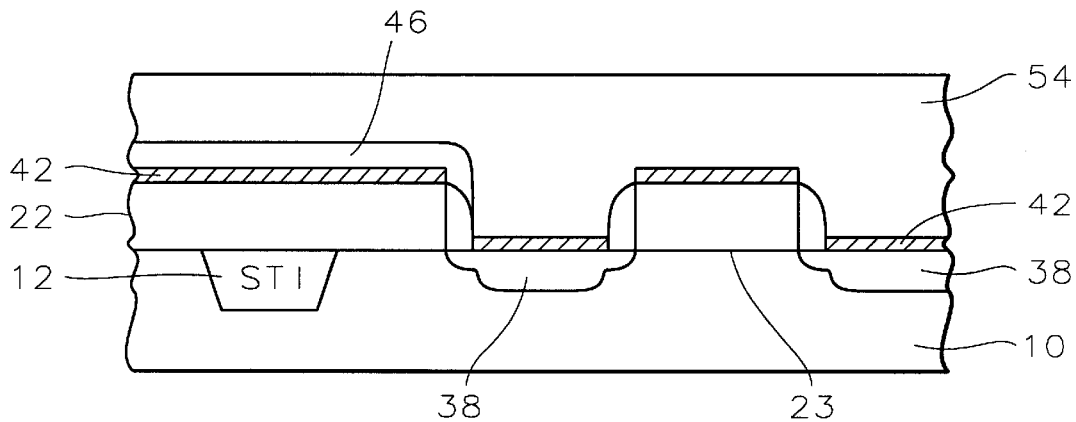

Now, the photoresist mask 50 is removed and a dielectric layer, such as borophosphosilicate glass (BPSG) 54 or the like is deposited over the substrate and planarized by reflow or other methods conventional in the art and as illustrated in FIG. 10.

Figure 11:
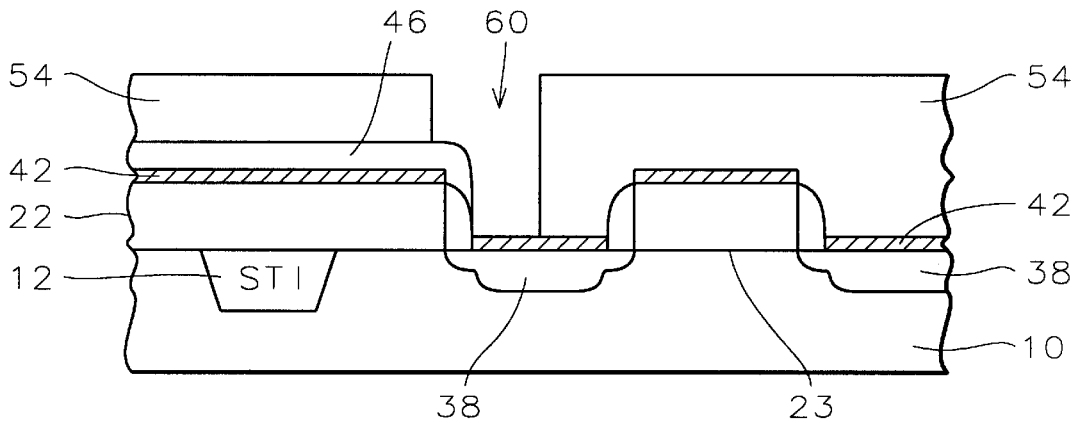

Referring now to FIG. 11, a contact photomask, not shown, is formed over the substrate. The BPSG 54 is etched away where it is not covered by the contact mask to open the self-aligned contact 60 and the gate contacts and normal diffusion contacts (not shown). All of these contacts can be opened simultaneously. The contact etch will need to have high etch selectivity between BPSG and the liner nitride in order to prevent shortage between the contact to the gate polysilicon while maintaining high etch selectivity to silicon. Selectivity of BPSG to the poly-cap layer 46 should be greater than about 10.

Since the liner nitride has already been removed from the gate contact regions (not shown), those contacts are formed in the same process steps without the need for an additional masking process. The silicon nitride liner layer 46 forms the narrowed self-aligned contact with zero spacing between the SAC contact to the polysilicon gate 22. A true zero spacing can be achieved by the special layout of the present invention. The process is much easier than in the prior art. The poly-cap layer spacing is no longer the design rule. This fact moves processing of this layer from critical to non-critical in photolithography and etching. The misalignment of poly-cap to poly (O) can be larger, allowing process variation and better yield.

Figure 12:
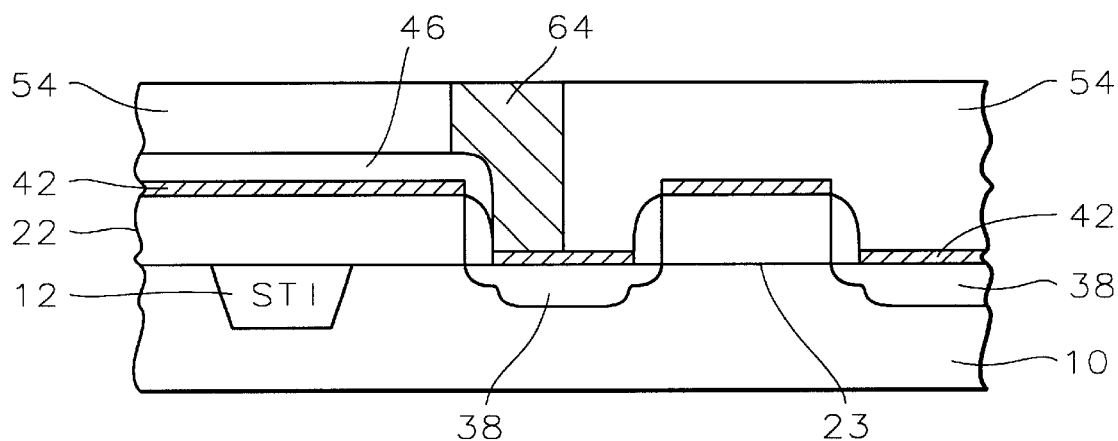

FIG. 12 illustrates the completion of the SAC contact with the filling of the contact opening with a metal layer, such as tungsten plug 64, as shown.

The inventors have designed a static random access memory (SRAM) cell using the special layout method of the present invention. By using the SAC process with poly-cap and the special layout of the invention, we can achieve a cell size 20% smaller than the size of a cell designed without the SAC process of the invention. The process for the poly-cap module of the present invention is much easier than the pseudo-SAC process in the co-pending patent application discussed above because of the relaxed space.

Figure 13:
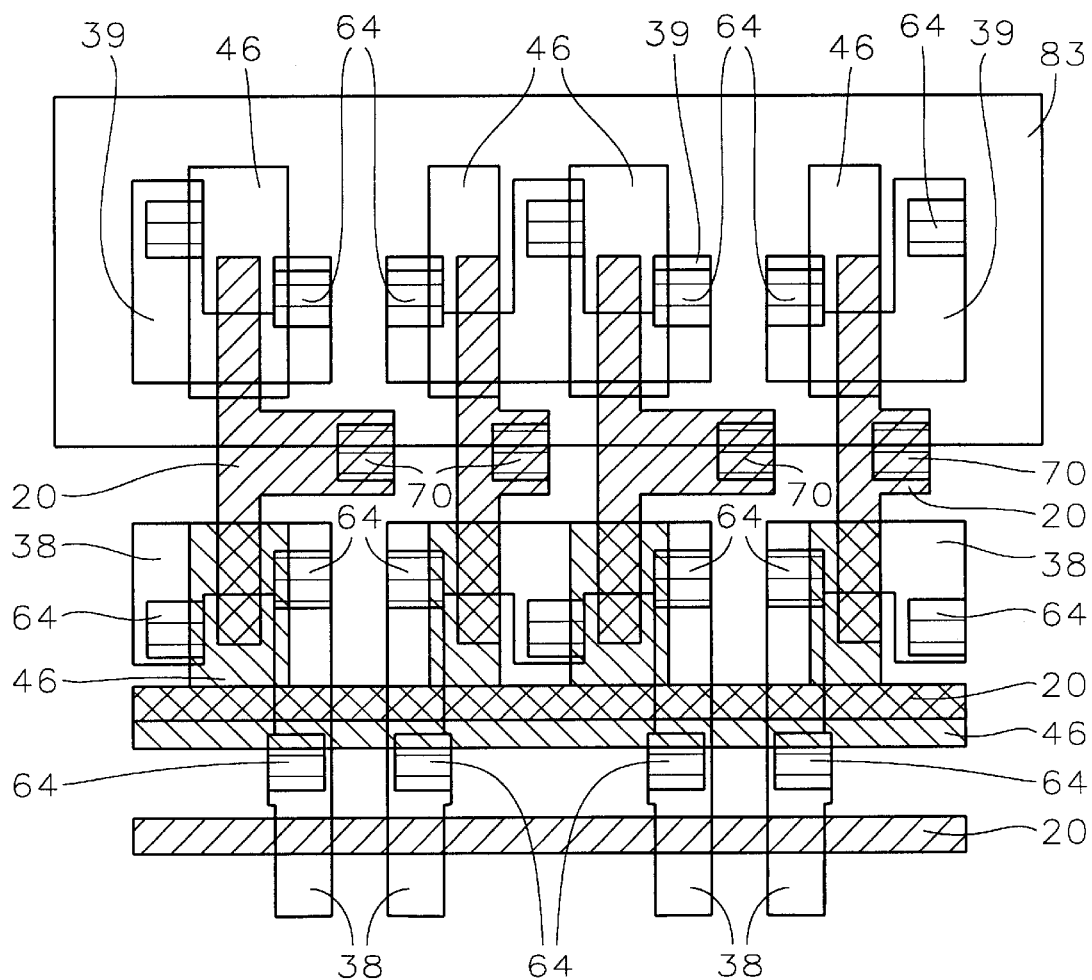
FIG. 13 is a top view representation of a SRAM device designed according to the process of the present invention.

The six-transistor SRAM cell having four cross-coupled contacts designed by the inventors is illustrated in top view in FIG. 13. Metal and via layers are not shown here for clarity. N-well 83 is shown. Polysilicon lines 20 are shown partially covered by the poly-cap layer 46. N-diffusion areas 38 and P-diffusion areas 39 are shown. Contacts 64 are the SAC contacts of the invention. Contacts 70 are poly contacts.

The process of the present invention integrates the salicide process for logic circuits with the self-aligned contact process for memory circuits so that memory and logic devices can be fabricated together on the same wafer. The poly-cap masking process with special layout of the present invention allows the self-aligned contact process to be easily plugged into the standard salicide logic process and implemented without extremely tight process control.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing a pair of gate electrodes and associated source and drain regions overlying a semiconductor substrate wherein nitride spacers are formed on sidewalls of said gate electrodes;

depositing a poly-cap layer overlying said gate electrodes and source and drain regions;

selectively removing said poly-cap layer overlying one of said source and drain regions between said gate electrode pair where a self-aligned contact is to be formed and removing said poly-cap layer over a first one of said gate electrode pair;

depositing an insulating layer over the surface of said semiconductor substrate;

forming said planned self-aligned contact opening through said insulating layer to said one of said source and drain regions wherein said contact opening partially overlies said poly-cap layer over a second one of said pair of gate electrodes; and filling said self-aligned contact opening with a conducting layer to complete the fabrication of said integrated circuit device.

2. The method according to claim 1 further comprising before said step of depositing said poly-cap layer:

depositing a metal layer over said gate electrodes and said semiconductor substrate;

annealing said semiconductor substrate whereby said metal layer is transformed into a metal silicide layer over said gate electrodes and over said source and drain regions associated with said gate electrodes; and removing said metal layer which is not transformed into metal silicide overlying said spacers to leave said metal silicide layer only on the top surface of said gate electrodes and on the top surface of said semiconductor substrate overlying said source and drain regions associated with said gate electrodes resulting in salicided gate electrodes and salicided source and drain regions.

3. The method according to claim 2 wherein said metal layer comprises titanium and wherein said metal silicide layer comprises titanium silicide.

4. The method according to claim 1 wherein said poly-cap layer comprises silicon nitride having a thickness of between about 300 and 1000 Angstroms.

5. The method according to claim 1 wherein said poly-cap layer comprises a first layer of silicon dioxide having a thickness of between about 100 and 600 Angstroms and a second layer of silicon nitride having a thickness of between about 300 and 1000 Angstroms.

6. The method according to claim 1 wherein said insulating layer comprises borophosphosilicate glass.

7. The method according to claim 1 wherein said conducting layer comprises tungsten.

8. A method of fabricating an integrated circuit device comprising:

providing a pair of gate electrodes and associated source and drain regions overlying a semiconductor substrate wherein nitride spacers are formed on sidewalls of said gate electrodes;

depositing a metal layer over gate electrodes and said semiconductor substrate;

annealing said semiconductor substrate whereby said metal layer is transformed into a metal silicide layer over said gate electrodes and over said source and drain regions associated with said gate electrodes;

removing said metal layer which is not transformed into metal silicide overlying said spacers to leave said metal silicide layer only on the top surface of said gate electrodes and on the top surface of said semiconductor substrate overlying said source and drain regions associated with said gate electrodes resulting in salicided gate electrodes and salicided source and drain regions;

depositing a poly-cap layer overlying said substrate including said salicided gate electrodes and source and drain regions;

selectively removing said poly-cap layer overlying one of said salicided source and drain regions where a self-aligned contact is to be formed and removing said poly-cap layer over a first one of said gate electrode pair;

depositing an insulating layer over the surface of said semiconductor substrate;

forming said planned self-aligned contact opening through said insulating layer to said one of said source and drain regions wherein said contact opening partially overlies said poly-cap layer over a second one of said pair of gate electrodes; and filling said self-aligned contact opening with a conducting layer to complete the fabrication of said integrated circuit device.

9. The method according to claim 8 wherein said metal layer comprises titanium and wherein said metal silicide layer comprises titanium silicide.

10. The method according to claim 8 wherein said poly-cap layer comprises silicon nitride having a thickness of between about 300 and 1000 Angstroms.

11. The method according to claim 8 wherein said poly-cap layer comprises a first layer of silicon dioxide having a thickness of between about 100 and 600 Angstroms and a second layer of silicon nitride having a thickness of between about 300 and 1000 Angstroms.

12. The method according to claim 8 wherein said insulating layer comprises borophosphosilicate glass.

13. The method according to claim 8 wherein said conducting layer comprises tungsten.

14. A method of fabricating an integrated circuit device comprising:

providing a gate electrode and associated source and drain regions overlying a semiconductor substrate wherein nitride spacers are formed on sidewalls of said gate electrode;

depositing a poly-cap layer overlying said gate electrode and source and drain regions;

selectively removing said poly-cap layer overlying one of said source and drain regions where a self-aligned contact is to be formed;

depositing an insulating layer over the surface of said semiconductor substrate;

forming said planned self-aligned contact opening through said insulating layer to said one of said source and drain regions wherein said contact opening partially overlies said poly-cap layer over a second one of said pair of gate electrodes; and filling said self-aligned contact opening with a conducting layer to complete the fabrication of said integrated circuit device.

15. The method according to claim 14 before said step of depositing said poly-cap layer further comprising:

depositing a metal layer over said gate electrode and said semiconductor substrate;

annealing said semiconductor substrate whereby said metal layer is transformed into a metal silicide layer over said gate electrode and over said source and drain regions associated with said gate electrode; and removing said metal layer which is not transformed into metal silicide overlying said spacers to leave said metal silicide layer only on the top surface of said gate electrode and on the top surface of said semiconductor substrate overlying said source and drain regions associated with said gate electrode resulting in a salicided gate electrode and salicided source and drain regions.

16. The method according to claim 15 wherein said metal layer comprises titanium and wherein said metal silicide layer comprises titanium silicide.

17. The method according to claim 14 wherein said poly-cap layer comprises silicon nitride having a thickness of between about 300 and 1000 Angstroms.

18. The method according to claim 14 wherein said poly-cap layer comprises a first layer of silicon dioxide having a thickness of between about 100 and 600 Angstroms and a second layer of silicon nitride having a thickness of between about 300 and 1000 Angstroms.

19. The method according to claim 14 wherein said insulating layer comprises borophosphosilicate glass.

20. The method according to claim 14 wherein said conducting layer comprises tungsten.

* * * * *